United States Patent
Fujita

(10) Patent No.: US 11,574,888 B2
(45) Date of Patent: Feb. 7, 2023

(54) COMPONENT JOINING APPARATUS, COMPONENT JOINING METHOD AND MOUNTED STRUCTURE

(71) Applicant: Panasonic Intellectual Property Management Co., Ltd., Osaka (JP)

(72) Inventor: Ryo Fujita, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 806 days.

(21) Appl. No.: 16/205,184

(22) Filed: Nov. 29, 2018

(65) Prior Publication Data

US 2019/0189586 A1 Jun. 20, 2019

(30) Foreign Application Priority Data

Dec. 15, 2017 (JP) .............................. JP2017-240223
Oct. 31, 2018 (JP) .............................. JP2018-204567

(51) Int. Cl.
*H01L 23/00* (2006.01)
*H01L 33/62* (2010.01)
(Continued)

(52) U.S. Cl.
CPC .............. *H01L 24/75* (2013.01); *B23K 1/008* (2013.01); *B23K 1/0016* (2013.01); *B23K 1/19* (2013.01);
(Continued)

(58) Field of Classification Search
CPC ......... H01L 24/75; H01L 24/32; H01L 33/62; H01L 24/83; H01L 2224/32245;
(Continued)

(56) References Cited

U.S. PATENT DOCUMENTS

2002/0031849 A1* 3/2002 Maruyama ......... G01R 31/2891
438/14
2007/0131734 A1* 6/2007 Hosseini ................. H01L 24/83
228/101
(Continued)

FOREIGN PATENT DOCUMENTS

CN 104347382 2/2015
JP 62-213486 9/1987
(Continued)

OTHER PUBLICATIONS

English language translation of Chinese Search Report dated Nov. 18, 2022 in corresponding Chinese Patent Application No. 201811490671.5.

*Primary Examiner* — Robert G Bachner
(74) *Attorney, Agent, or Firm* — Wenderoth, Lind & Ponack, L.L.P.

(57) ABSTRACT

A component joining apparatus, which can realize positioning between a component and a substrate with high accuracy by avoiding influence of thermal expansion of the substrate at the time of joining the component to the substrate by heating at a high temperature, includes a component supply head holding a component and a heating stage heating and holding a substrate, in which a heating region where the heating stage contacts the substrate includes a joining region of the substrate in which the component is joined, and the substrate is larger than the heating stage and a peripheral part of the substrate does not contact the heating stage.

14 Claims, 6 Drawing Sheets

(51) Int. Cl.

| | |
|---|---|
| H01L 33/64 | (2010.01) |
| B23K 3/03 | (2006.01) |
| B23K 35/26 | (2006.01) |
| B23K 1/00 | (2006.01) |
| B23K 1/20 | (2006.01) |
| B23K 37/00 | (2006.01) |
| B23K 3/08 | (2006.01) |
| B23K 1/008 | (2006.01) |
| B23K 3/04 | (2006.01) |
| B23K 1/19 | (2006.01) |
| B23K 103/00 | (2006.01) |
| B23K 103/12 | (2006.01) |
| H01L 33/48 | (2010.01) |
| B23K 101/36 | (2006.01) |
| B23K 101/42 | (2006.01) |
| B23K 103/18 | (2006.01) |

(52) U.S. Cl.
CPC .............. *B23K 1/20* (2013.01); *B23K 3/0338* (2013.01); *B23K 3/04* (2013.01); *B23K 3/08* (2013.01); *B23K 3/087* (2013.01); *B23K 35/262* (2013.01); *B23K 37/003* (2013.01); *H01L 24/32* (2013.01); *H01L 24/83* (2013.01); *H01L 33/62* (2013.01); *H01L 33/641* (2013.01); *B23K 2101/36* (2018.08); *B23K 2101/42* (2018.08); *B23K 2103/12* (2018.08); *B23K 2103/18* (2018.08); *B23K 2103/56* (2018.08); *H01L 33/486* (2013.01); *H01L 2224/32245* (2013.01); *H01L 2224/75253* (2013.01); *H01L 2224/75744* (2013.01); *H01L 2224/83075* (2013.01); *H01L 2224/83815* (2013.01); *H01L 2924/014* (2013.01); *H01L 2924/0105* (2013.01); *H01L 2924/01079* (2013.01); *H01L 2924/12041* (2013.01); *H01L 2924/15747* (2013.01); *H01L 2933/0066* (2013.01); *H01L 2933/0075* (2013.01)

(58) Field of Classification Search
CPC .... H01L 2924/12041; H01L 2924/014; B23K 3/0338; B23K 35/262
See application file for complete search history.

(56) References Cited

U.S. PATENT DOCUMENTS

| | | | |
|---|---|---|---|
| 2015/0034133 A1* | 2/2015 | Kim | H01L 21/67051 134/105 |
| 2018/0122661 A1* | 5/2018 | Adachi | H01L 21/67109 |

FOREIGN PATENT DOCUMENTS

| | | |
|---|---|---|
| JP | 2-163945 | 6/1990 |
| JP | 6-252183 | 9/1994 |
| JP | 10-335391 | 12/1998 |
| JP | 11-026929 | 1/1999 |
| JP | 2001-351949 | 12/2001 |
| JP | 2002-353612 | 12/2002 |
| JP | 2009-267349 | 11/2009 |
| JP | 2015-15330 | 1/2015 |
| WO | 2010/050209 | 5/2010 |

* cited by examiner

COMPONENT JOINING APPARATUS, COMPONENT JOINING METHOD AND MOUNTED STRUCTURE

TECHNICAL FIELD

The technical field relates to a component joining apparatus, a component joining method and a mounted structure. The technical field particularly relates to a component joining technique capable of avoiding influence of thermal expansion of a substrate at the time of joining a component to the substrate by heating at a high temperature to thereby realize highly accurate positioning between the component and the substrate.

BACKGROUND

As a method of joining and positioning the component with high accuracy in a related-art component joining apparatus, there is an apparatus having a structure of performing positioning using pins or the like (for example, refer to JP-A-S62-213486 (Patent Literature 1). FIG. 5 and FIG. 6 show a related-art positioning structure disclosed in Patent Literature 1. FIG. 5 is a plan view of a solid-state imaging apparatus. FIG. 6 is a cross-sectional view taken along A-A of FIG. 5.

First, a ceramic receptacle 22 in which a solid-state imaging device 21 having a cover glass 26 on a top surface thereof is fixed and positioning members 23 and 24 having holes for positioning 23a and 24a made of metal are prepared.

Next, a solder 25 in a paste state with a high melting point is applied to the positioning members 23 and 24.

At the time of joining, the ceramic receptacle 22 is set in an assembly jig and reference pins of the assembly jig are inserted into the holes 23a and 24a to be heated and joined.

As a result, the positioning members 23 and 24 having the holes for positioning 23a and 24a are joined to the ceramic receptacle 22. The positioning members 23 and 24 are joined to portions of notched grooves 22a and notched portions 22b. The solid-state imaging apparatus is fitted to a substrate and the like by using the holes for positioning 23a and 24a.

However, the component is thermally expanded from positions of reference pins as references at the time of joining with solder at a high temperature in the related-art structure, therefore, positioning accuracy will deteriorate due to the difference in shapes between joining parts and joined parts of the component caused by thermal expansion.

SUMMARY

In view of the above, an object of the present application is to provide a component joining apparatus, a component joining method and a mounted structure capable of suppressing deterioration of positioning accuracy due to the difference in shapes between joining parts and the joined parts of the component caused by thermal expansion.

In order to achieve the above object, there is provided a component joining apparatus including a component supply head holding a component and a heating stage heating and holding a substrate, in which a heating region where the heating stage contacts the substrate includes a joining region of the substrate in which the component is joined, and the substrate is larger than the heating stage and a peripheral part of the substrate does not contact the heating stage.

There is also provided a component joining method including the steps of arranging a joining region of a substrate over a heating region of a heating stage as a step of setting the substrate, arranging solder on the heating region of the substrate to be heated and cooled as a stop of temporarily fixing the solder and melting the solder to join the component as a step of joining the component.

There is further provided a mounted structure including a substrate, a component mounted on one surface of the substrate, a first region thermally treated so as to include the entire region on which the component is mounted in plan view on the other side of the substrate, and a second region not thermally treated and surrounded by the first region on the other side of the substrate.

When the above structure and the joining method are adopted, a positioning error due to thermal expansion of the substrate can be minimized at the time of joining the component while heating the substrate at a high temperature.

DESCRIPTION OF EMBODIMENTS

Hereinafter, embodiments of the present disclosure will be explained with reference to the drawings.

Embodiment 1

Figure 1A:
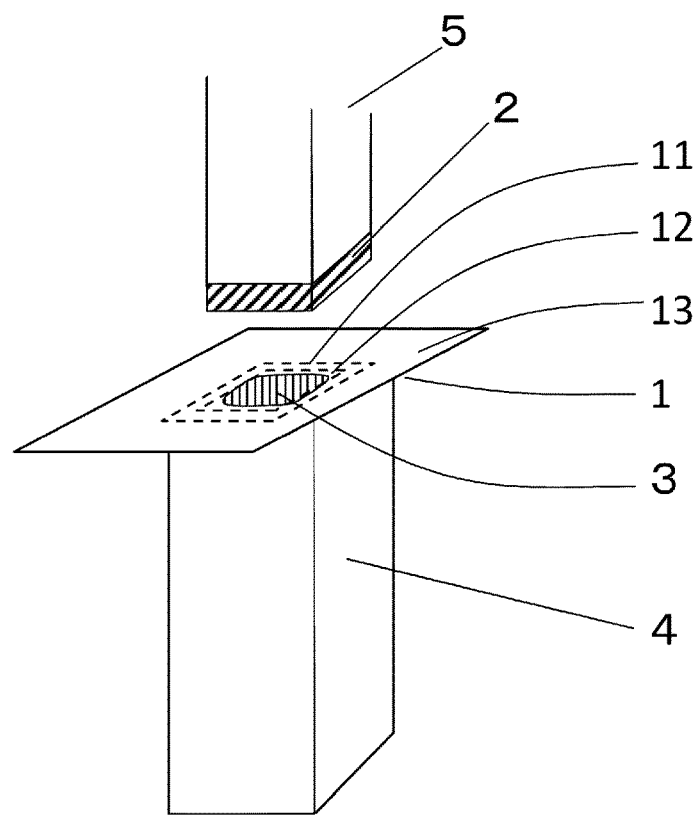
FIG. 1A is a perspective view of a component joining apparatus according to Embodiment 1 of the present disclosure.
Figure 1B:
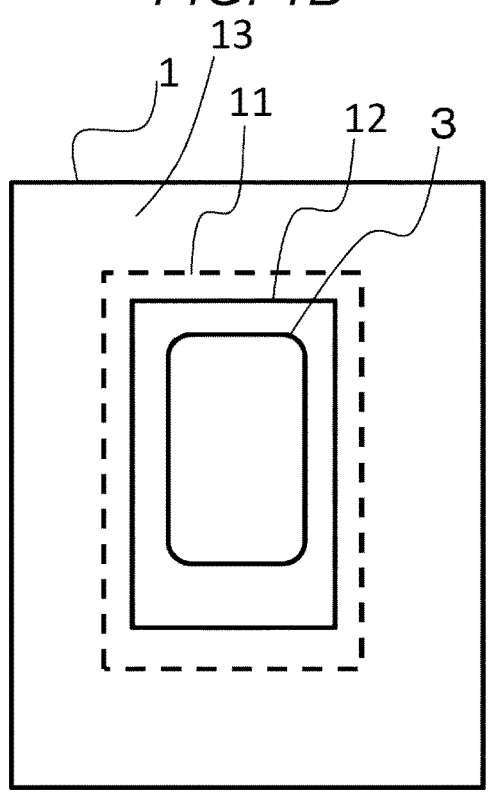
FIG. 1B is a plan view obtained when viewing a substrate from an upper surface in the component joining apparatus according to Embodiment 1 of the present disclosure.

FIG. 1A shows a perspective view of a joining apparatus according to Embodiment 1 of the present disclosure. FIG. 1B is a plan view seen from an upper surface of a substrate in a state where the substrate is set in a component joining apparatus according to Embodiment 1.

<Structure>

The component joining apparatus according to Embodiment 1 includes a component supply head 5 and a heating stage 4.

<Component Supply Head 5>

The component supply head 5 can suck and hold a component 2 and a solder 3 to thereby position them on a substrate 1 arranged on the heating stage 4. The component supply head 5 can be moved upward and downward at the time of joining. The component supply head 5 can pressurize the component 2 with respect to the substrate 1 at the time of joining.

<Heating Stage 4>

The heating stage 4 can suck and hold the substrate 1, and can also heat the substrate 1. The heating stage 4 has a size including a joining region 12 to which the substrate 1 is joined. The joining region 12 is a region in which the component and so on are joined and is within the substrate 1.

A region contacting the heating stage 4 in the substrate 1 is a heating region 11. The substrate 1 is larger than the heating stage 4. The heating region 11 is positioned on one surface of the substrate 1 and the joining region 12 is positioned on the other surface of the substrate 1. When the substrate 1 is seen in plan view, the heating region 11 includes the joining region 12.

The heating of the heating stage 4 is performed by using a method such as pulse heat that can perform rapid heating. That is because the present embodiment includes joining processes in which the solder 3 is heated and melted, then, cooled and solidified after that, therefore, it is necessary to perform rapid heating and high-speed cooling.

Here, a non-heating region 13 other than the heating region 11 in the substrate 1 is prevented from receiving external force, for example, by being floated in the air. When the substrate 1 is thermally expanded while the substrate 1 is sucked and held, the temperature difference between the heating stage 4 and the substrate 1 is not zero, and linear expansion coefficients are different from each other, therefore, the heating stage 4 is displaced with respect to the substrate 1 with any place in the heating region 11 contacted by the both members as a base point.

As the base point is determined by minute unevenness on contact surfaces of the both members, it is difficult to control the base point.

The heating stage 4 and the substrate 1 are cooled when solidifying the solder, displacement occurs also in this case with any place on the contact surfaces of both members as the base point in the same manner.

Accordingly, the base point of the thermal expansion on the substrate 1 will be within the joining region 12 by floating the non-heating region 13 in the air, thereby minimizing the amount of displacement of the substrate 1 with respect to the heating stage 4 due to expansion and contraction of the substrate 1 and the heating stage 4.

When the non-heating region 13 is separated from the heating stage 4, cooling time of the substrate 1 until the solder 3 is solidified can be reduced at the same time.

The component joining apparatus according to Embodiment 1 mounts the component 2 on the substrate 1.

The non-heating region 13 is also a region other than the joining region 12 of the substrate 12.

<Component 2>

The component 2 is an LED package, having a size of approximately 5 mm square. It is desirable that an entire back surface is joined to a material having a high thermal conductivity such as solder for dissipating heat of the LED. The component may be a LED device, a semiconductor bare chip, a semiconductor package, a power module or the like in addition to the LED package.

<Substrate 1>

The substrate 1 is a copper substrate. As the LED package is a target in the present embodiment, the copper substrate is used for increasing heat dissipation properties, however, the material does not matter. The size is approximately 30 mm square and a thickness is approximately 2 mm. Though the size is not limited for achieving the present embodiment, the greater the difference in side between the component 2 and the substrate 1 is, the greater the effect can be obtained.

There are the heating region 11 contacting the heating stage 4 at the back surface and the joining region 12 to which the component 2 is joined inside the heating region 11 in the substrate 1, and the remaining region on the substrate 1 corresponds to the non-heating region 13.

<Solder 3>

As the solder 3, a solid-state AuSn solder is used. This is because it is necessary to have a high melting point for mounting a SMT component on the substrate after that. However, it is not essential in the present embodiment and normal solder may be used. It is also possible to use materials other than solder which can be used for joining by heating.

<Processes>

(1) Process of Setting Substrate 1

First, positioning is performed so that the heating region 11 of the substrate 1 corresponds to an outline of the heating stage 4, and the substrate 1 is arranged on the heating stage 4 to be sucked and held. According to the arrangement, the base point at which relative positional displacement with respect to the heating stage 4 occurs when the substrate 1 is thermally expanded can be within the joining region 12, as a result, positional displacement between the substrate 1 and the component 2 can be minimized.

(2) Temporary Fixing Process by Solder 3

The solder 3 is sucked and held by the component supply head 5 and is put within the joining region 12 of the substrate 1 while being positioned in a horizontal direction. After that, heating of the heating stage 4 is started. After the temperature of the heating stage 4 reaches a prescribed temperature, the component supply head 5 is lowered to pressurize the solder 3 onto the substrate 1 and the solder 3 is temporarily fixed to the substrate 1 by holding the pressurized state for a certain period of time. After that, heating of the heating stage 4 is stopped and the suction of the component supply head 5 is broken to be moved upward. The temperature and time of heating and pressurization at this time are set so that the solder 3 is not liquefied in a state of being joined to the substrate 1.

(3) Process of Joining Component 2

The component 2 is joined after the solder 3 is temporary fixed. First, the component 2 is sucked and held by the component supply head 5. After that, the component supply head 5 is accurately positioned so that the component 2 is positioned over the joining region 12 of the substrate 1.

Then, the heating of the heating stage 4 is started. After the temperature of the heating stage 4 reaches a prescribed temperature, the component supply head 5 is lowered to pressurize the substrate 1 and the pressurized state is held for a certain period of time.

After that, the heating of the heating stage 4 is stopped, and the process waits for cooling of the heating stage 4 and the substrate 1 until a joined part is wetly spread, the temperature is decreased and the solder 3 is solidified. After the temperature at the joined part is decreased and the solder 3 is solidified, the suction of the component supply head 5 is broken and the head is moved upward.

Here, as the temperature at which the joining is started, the component supply head 5 is lowered and the joining operation is performed in a state where the solder 3 is sufficiently melted. If the component 2 contacts the solder 3 before melting the solder 3, a small amount of air is sucked into the solder 3 due to a minute uneven state on the surface at the time of melting the solder 3, which generates voids easily. On the other hand, when the solder 3 is previously melted, the surface will be a curved surface due to surface tension. Accordingly, when the component 2 contacts the solder 3 from above, the component 2 can contact the solder 3 from an apex of the curved surface gradually, therefore, the gas is hardly sucked and voids are hardly generated.

<Effects>

The substrate 1 expands by heating at the time of joining and contracts at the time of cooling. However, positional displacement of the substrate 1 due to thermal expansion can be minimized at the time of joining by allowing the heating region 11 to approximately correspond to the joining region 12.

Moreover, the region other than the heating region 11 (a peripheral region of the substrate 1) in which the substrate 1 is held does not receive external force, therefore, relative positional relationship between the component 2 and the substrate 1 is not affected even when the substrate 1 is expanded around the heating region 11.

As the joining region 12 is within the heating region 1, relative positions of the substrate 1 and the component 2 are not changed. The relative positions of the substrate 1 and the component 2 are also not changed when the substrate 1 is cooled after the heating until the solder 3 is solidified.

As described above, the component 2 can be accurately positioned and joined to the substrate 1 while eliminating the influence of positional displacement by expansion and contraction due to temperature variation of the substrate 1 caused by heating and cooling when adopting the present structure.

Embodiment 2

Figure 2:
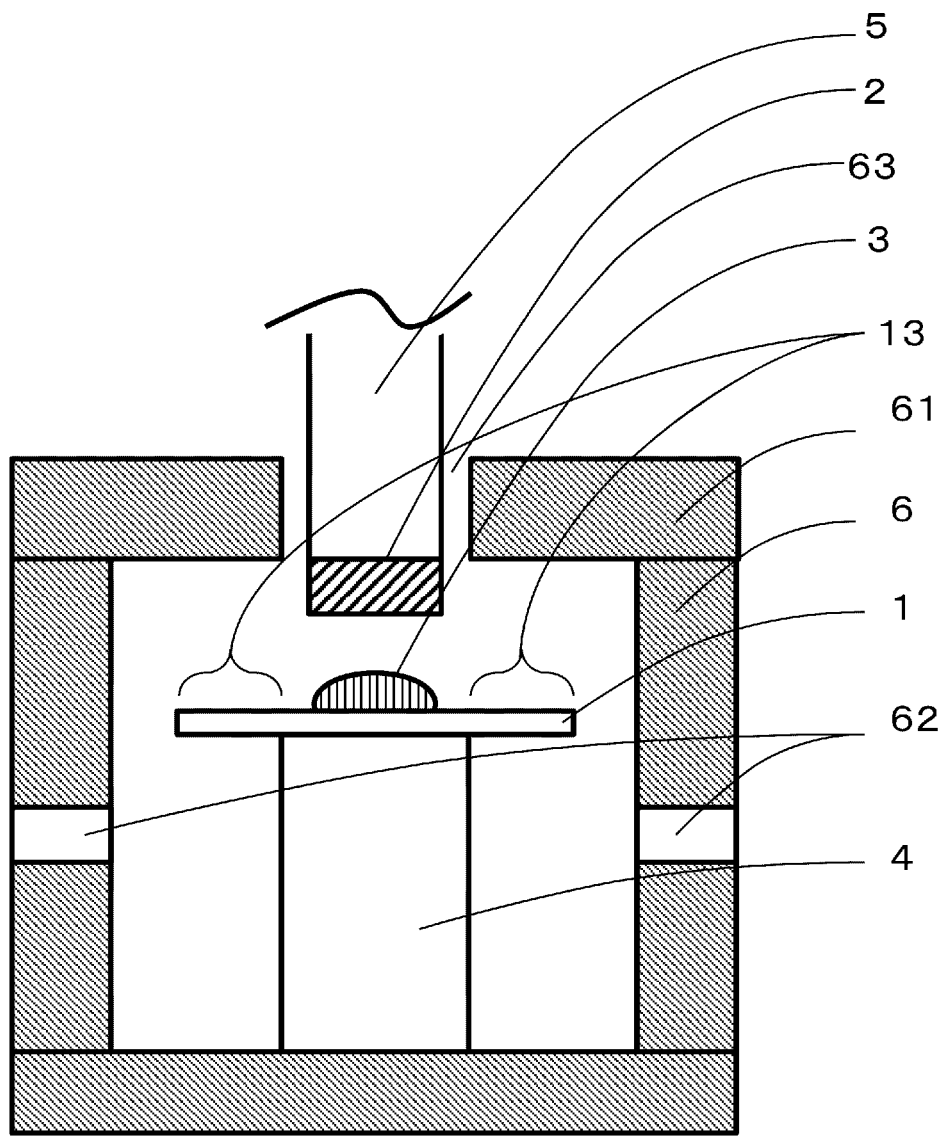
FIG. 2 is a cross-sectional view showing a component joining apparatus according to Embodiment 2 of the present disclosure.

FIG. 2 shows a structure according to Embodiment 2 of the present embodiment. A component joining apparatus according to Embodiment 2 includes the component supply head 5, the heating stage 4 and a chamber 6.

Embodiment 2 differs from Embodiment 1 in a point that the heating stage 4 and the substrate 1 are arranged inside the chamber 6. Items not explained are the same as those of Embodiment 1.

<Structure>

The substrate 1 is sucked and held on the heating stage 4, the solder 3 is arranged over an upper surface of the substrate 1 and the component supply head 5 sucking and holding the component 2 is provided above the solder 3. Moreover, the chamber 6 is arranged so as to surround the heating stage 4 and the substrate 1.

The chamber 6 has gas supply ports 62 at walls in positions in a horizontal direction of the substrate 1, a chamber lid 61 on an upper surface and an opening 63 for the component supply head for supplying the component 2 in the chamber lid 61.

<Process>

(1) Process of Setting Substrate 1

First, the chamber lid 61 is opened and positioning is performed so that the heating region 11 of the substrate 1 corresponds to an outline of the heating stage 4. The substrate 1 is sucked and held on the heating stage 4. After that, the chamber lid 61 is closed.

(2) Process of Temporarily Setting Solder 3

First, an inert gas such as nitrogen is supplied from the gas supply ports 62 to fill the chamber 6. After an oxygen concentration is sufficiently reduced, the chamber lid 61 is opened and the solder 3 is sucked and held by the component supply head 5 to be put within the joining region 12 on the substrate 1 while being positioned. The component supply head 5 is moved upward to block the opening 63 for the component supply head, and the component supply head 5 is allowed to stand by at a position where the component supply head 5 does not contact the solder 3 on the substrate 1.

After that, the inert gas is supplied from the gas supply ports 62 and the oxygen concentration in the chamber 6 is reduced. After that, the heating of the heating stage 4 is started. After the temperature of the heating stage 4 reaches a prescribed temperature, the component supply head 5 is lowered.

The solder 3 is pressurized onto the substrate 1 by the component supply head 5 and the pressurized state is held for a certain period of time.

After that, the heating of the heating stage 4 is stopped and the suction of the component supply head 5 is broken to be move upward. The temperature and time of heating and pressurization at this time are set so that the solder 3 is not liquefied and so that the component 2 is temporarily fixed to the substrate 1.

(3) Process of Joining Component 2

The component 2 is joined to the substrate 1 after the solder 3 is temporary fixed. First, the component 2 is sucked and held by the component supply head 5. After that, the component 2 is moved over the joining region 12 of the substrate 1. Then, the component supply head 5 is lowered and allowed to stand by at a position where the component 2 blocks the opening 63 for the component supply head in the chamber 61 as well as the component 2 does not contact the solder 3 on the substrate 1.

After that, the inert gas is supplied from the gas supply ports 62 to reduce oxygen concentration inside the chamber 6. Then, the heating of the heating stage 4 is started. After the temperature of the heating stage 4 reaches a prescribed temperature and reaches a target oxygen concentration, the component supply head 5 is lowered to pressurize the substrate 1 and the pressurized state is held for a certain period of time.

After that, the heating of the heating stage 4 is stopped, and the process waits for cooling of the heating stage 4 and the substrate 1 until a joined part is wetly spread, the temperature is decreased and the solder 3 is solidified.

Meanwhile, the supply of the inert gas is continued from the gas supply ports 62 and the inert gas is applied to the non-heating region 13 of the substrate 1 to thereby accelerate the cooling of the substrate 1 and improve productivity of the process.

After the temperature at the joined part is decreased and the solder 3 is solidified, the suction of the component supply head 5 is broken and the head is moved upward.

The opening 63 for the component supply head is positioned just above the heating stage 4 or the substrate 1. Accordingly, slight adjustment is sufficient for the positioning of the component supply head 5 in the horizontal direction, which can be made for a short period of time.

<Advantages>

According to the structure, it is possible to eliminate the influence of positional displacement by expansion and contraction due to temperature variation of the substrate 1 caused by heating and cooling at the time of joining the component 2 to the substrate 1 by the solder 3. The accurate positioning of the component 2 to the substrate 1 can be achieved. Moreover, joining with high productivity can be realized by reducing the cooling time of the substrate 1.

When the position of the opening 63 for the component supply head in the chamber lid 61 is closed by the component supply head 5, it is possible to prevent the inert gas from leaking. As a result, it is possible to reduce the period of time in which oxygen concentration in the chamber 6 is decreased and to increase the productivity.

The fabricated substrate 1 includes the component mounted on one surface of the substrate 1, a first region (heating region 11) thermally treated so as to include the entire region in plan view on which the component is mounted on the other surface of the substrate 1 and a second region (joining region 12) not thermally treated and surrounded by the first region on the other surface of the substrate 1.

In the thermally-treated first region (heating region 11), a trace of heating may remain. For example, the trace may be color, a crease, a thermal strain, a crystal structure on the surface.

Embodiment 3

Figure 3:
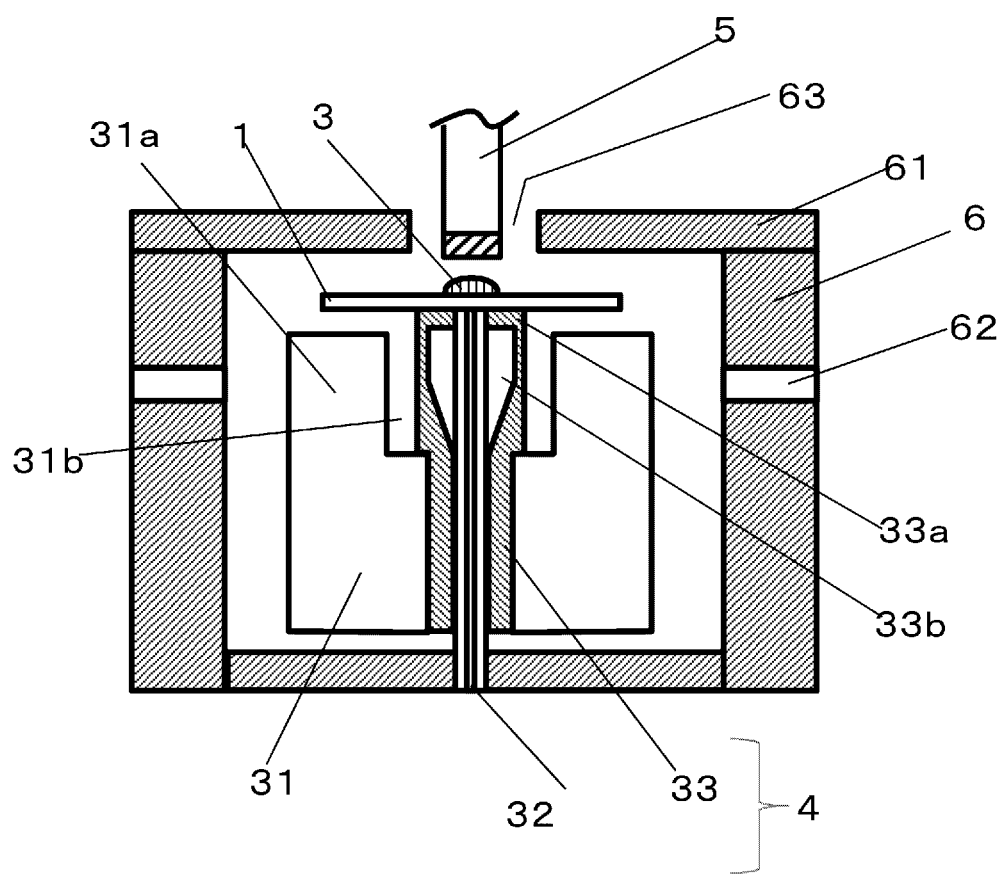
FIG. 3 is a cross-sectional view showing a component joining apparatus according to Embodiment 3 of the present disclosure.
Figure 4:
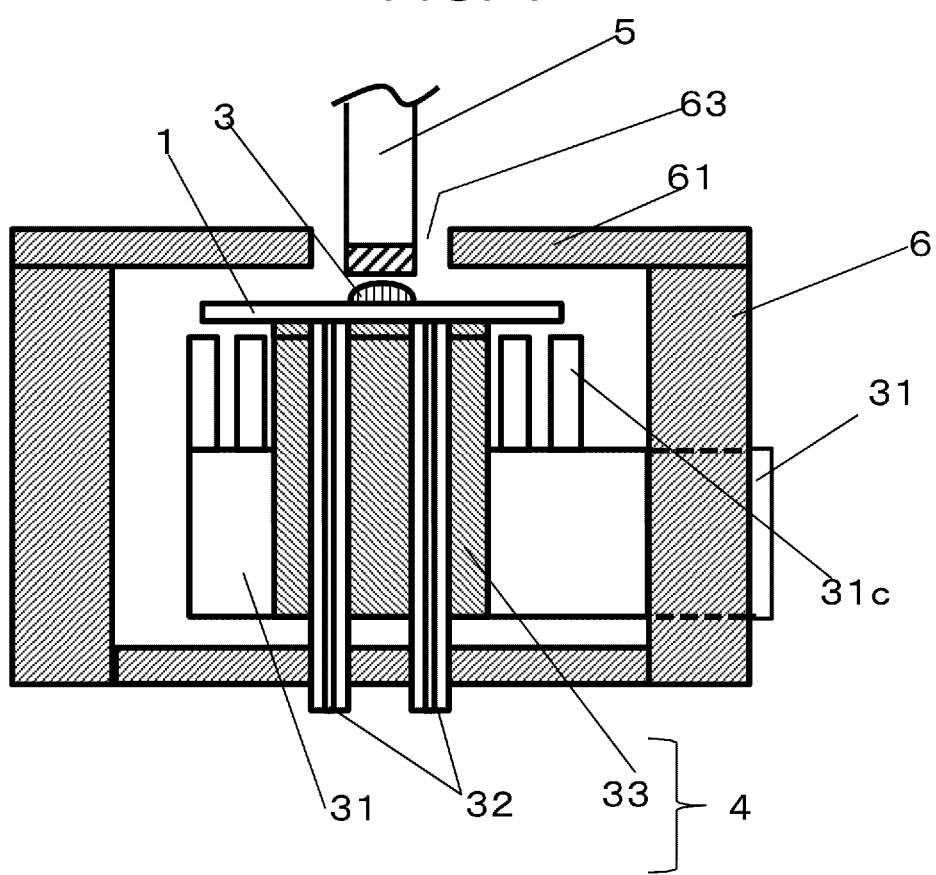
FIG. 4 is a cross-sectional view showing a component joining apparatus according to Embodiment 3 of the present disclosure.
Figure 5:
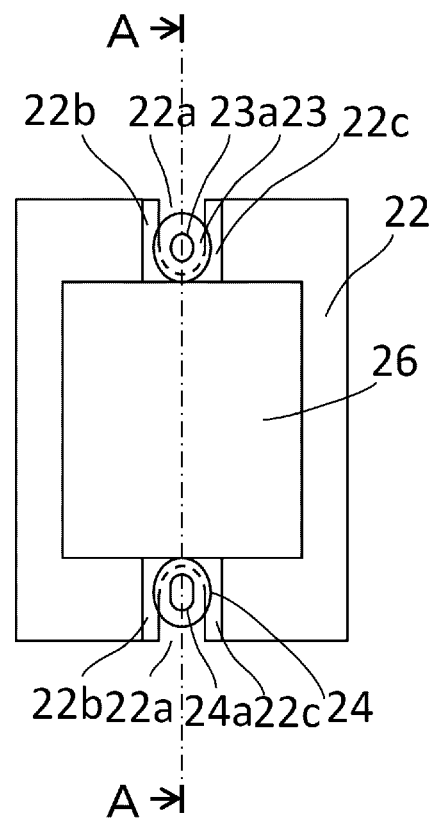
FIG. 5 is a plan view of an imaging apparatus for explaining a related-art positioning technique described in Patent Literature 1.
Figure 6:
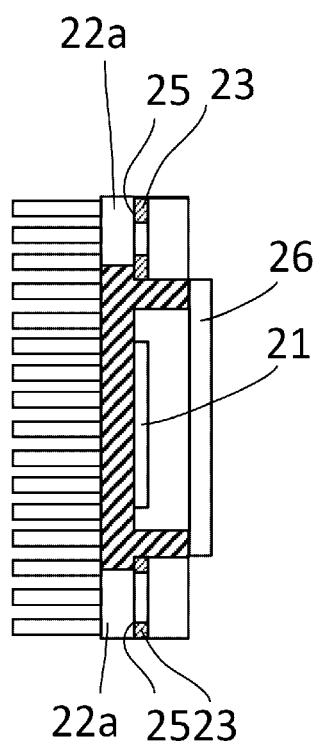
FIG. 6 is a cross-sectional view taken along A-A surface of FIG. 5.

FIG. 3 and FIG. 4 are cross-sectional views showing a structure in Embodiment 3. A component joining apparatus according to Embodiment 3 differs from those of Embodiments 1 and 2 in the structure of the heating stage 4.

Items not explained are the same as those of Embodiments 1 and 2. The chamber 6 is not essential and a case of not having the chamber 6 can be also adopted.

In FIG. 3, there are a heater 33, a suction hole 32 and fins 31. The suction hole 32 is for fixing the substrate 1 and is connected to a pump (not shown). The suction hole 32 is positioned on the center of the substrate 1 or on the center of the joining region 12. Plural holes may be provided but are positioned only at a central part.

The heater 33 exists also in the heating stage 4 according to Embodiments 1 and 2. As the heater, a pulse heater capable of rapidly increasing the temperature is preferably used.

A plurality of fins 31 are positioned around a side surface of the heater 33, on the contrary, for rapidly decreasing the temperature.

Moreover, the power is fed to the heater 33 through the fins 33 in this case.

A heater upper part 33*a* has a smaller cross sectional area than those of other parts of the heater 33. As the cross-sectional area is small, heat is generated by electric current. A heater opening 33*b* is provided, thereby reducing the cross-sectional area but increasing an outer diameter, as a result, the substrate 1 is easily placed thereon and easily heated.

Fin upper parts 31*a* do not contact the heater upper part 33*a* and a space 31*b* is formed. The space 31*b* is provided so that the heating by the heater upper part 33*a* is not interrupted. The position of the heater 33 is defined by the space 31*b*. That is, protruding portions of the heater 33 (portions with wider cross-sectional areas) contact a bottom surface of the space 31*b* and are fixed. The height of the heater 33 is constant and the position is also fixed only by inserting the heater 33 from above.

In FIG. 4, there are the heater 33, suction holes 32 and the fins 31 in the heating stage 4.

The suction holes 32 are for fixing the substrate 1 and are connected to a pump (not shown). The suction hole 32 is not positioned on the center of the substrate 1 or on the center of the joining region 12, but is arranged so as to surround the center of the substrate 1 or the center of the joining region 12.

A plurality of fins 31 are positioned around a side surface of the heater 33 for rapidly decreasing the temperature of the heater 33.

Moreover, the power is fed to the heater 33 through the fins 31 in this case.

There are a plurality of protrusions 31*c* at upper parts of the fins 31. The protrusions 31*c* are provided for improving heat dissipation properties.

A right end of the fin 31 pierces the chamber 6. Electric current is allowed to directly flow in the fins 31 from the outside. An internal volume of the chamber 6 is reduced.

(Overview)

The embodiments may be combined. For example, the structures of the inside of the chamber 6 in Embodiments 2 and 3 can be applied to Embodiment 1.

The component joining apparatus according to the embodiments is capable of minimizing the influence of thermal expansion of the substrate at the time of joining the component to the substrate by heating and performing positioning and joining with high accuracy, which can be applied to applications such as positioning and mounting of semiconductor devices such as a LED, an imaging device, a system LSI and a power module with high accuracy.

What is claimed is:

1. A component joining apparatus comprising:
   a component supply head holding a component; and
   a heating stage heating and holding a substrate,
   wherein a heating region where the heating stage contacts the substrate includes a joining region of the substrate in which the component is joined,
   the substrate is larger than the heating stage and a peripheral part of the substrate does not contact the heating stage,
   the substrate is heated and cooled while the peripheral part of the substrate is floated,
   the heating stage includes a heater, a suction hole, and fins, and
   the suction hole is provided in the heater.

2. The component joining apparatus according to claim 1, wherein the heating region is positioned on one surface of the substrate and the joining region is positioned on the other surface of the substrate, and
   the heating region includes the joining region when viewing the substrate in plan view.

3. The component joining apparatus according to claim 1, wherein regions other than the joining region of the substrate are in a non-contact state with the heating stage.

4. The component joining apparatus according to claim 1, further comprising:
   a chamber surrounding the heating stage.

5. The component joining apparatus according to claim 4, wherein the chamber is provided with an opening for the component supply head at or from which the component joining head enters or exits.

6. The component joining apparatus according to claim 4, wherein the chamber is provided with air supply ports.

7. The component joining apparatus according to claim 1, wherein the heater is provided at the center of the heating stage.

8. The component joining apparatus according to claim 1, wherein the fins are provided on a side surface of the heater.

9. The component joining apparatus according to claim 1, wherein the fins supply electric power to the heater.

10. The component joining apparatus according to claim 1, wherein the heating stage includes a pulse heater.

11. A component joining method comprising:
    arranging a joining region of a substrate over a heating region of a heating stage as a step of setting the substrate;
    arranging solder on the heating region of the substrate while a peripheral part of the substrate is floated as a step of temporarily fixing the solder; and melting the solder to join the component and cooling the solder to a solid state while the peripheral part of the substrate is floated as a step of joining the component.

12. The component joining method according to claim 11, wherein the component is held until the solder is solidified in the step of joining the component.

13. The component joining method according to claim 11, wherein a gas is blown to an outer side of the joining region of the substrate in the step of joining the component.

14. The component joining method according to claim 11, wherein the step of joining the component is performed in an inert gas.

* * * * *